United States Patent [19]

Rouvre et al.

[11] 4,028,738
[45] June 7, 1977

[54] CENTRAL CIRCUIT CONTROL PLATES FOR AUTOMOTIVE VEHICLES

[75] Inventors: Philippe Rouvre; Daniel Jean Augello, both of Billancourt, France

[73] Assignees: Regie Nationale des Usines Renault; Automobiles Peugeot, both of France

[22] Filed: Apr. 30, 1973

[21] Appl. No.: 355,424

[30] Foreign Application Priority Data

May 10, 1972 France .............................. 72.16824

[52] U.S. Cl. ............................. 361/403; 180/82 R
[51] Int. Cl.² ............................................. H05K 5/00
[58] Field of Search ..................... 324/15 R, 16 R; 180/90 R, 82 R; 317/101 CC, 101 R, 116, 101 C, 119; 174/72 A

[56] References Cited

UNITED STATES PATENTS

| | | | |
|---|---|---|---|
| 2,614,156 | 10/1952 | Nims | 180/90 R |
| 3,022,447 | 2/1962 | Henss | 180/90 R |
| 3,297,974 | 1/1967 | Pittman | 317/101 CC |
| 3,590,330 | 6/1971 | Teagno et al. | 317/116 |
| 3,617,870 | 2/1971 | Howes | 324/15 R |

*Primary Examiner*—David Smith, Jr.
*Attorney, Agent, or Firm*—Stevens, Davis, Miller & Mosher

[57] ABSTRACT

A central circuit control plate for the electrical equipment of motor vehicles which comprises in a compact form, a circuit unit determined beforehand for distributing control information to the various units of the equipment, the circuit unit being connected to a source of current and to the various grouped and/or separated members transmitting the information, the unit further comprising intermediate safety and control devices transmitting control information to the various load circuits of the vehicle.

1 Claim, 4 Drawing Figures

CENTRAL CIRCUIT CONTROL PLATES FOR AUTOMOTIVE VEHICLES

The present invention relates in general to central control plates for the circuit elements of electrical equipment of motor vehicles and is directed more particularly to an improved compact central circuit control plate of this character permitting assembly into a single unit of all the devices and means for controlling the delivery of current to the various electrical apparatus or load circuits of the vehicle.

It is already known to interconnect all the wires of a motor vehicle at a central point or station. On the other hand, it is also known to complete this central control point with a set of fuses.

However, the central control points thus created provide only incomplete and scarcely commercial solutions to the various problems arising when the interconnection of the various circuits of an automotive vehicle is contemplated.

It is the essential object of the present invention to provide a central circuit control plate capable of avoiding these inconveniences by permitting the interconnection of the various wiring circuits of the electrical equipment of a motor vehicle, together with the delivery of control information, the centralization within the passenger compartment of the mounting of the various apparatus being necessary for controlling the receivers or load circuits of said equipment, and the fastest and most economical connection of a fault-tracing and testing bench system permitting a complete checking and testing of the electrical equipment of the vehicle. This central circuit control plate is characterized essentially in that it combines into the same and single compact element a predetermined circuit unit for distributing the control information, which is connected to a source of current and also to the various control members, whether grouped or separated, transmitting the information, said circuit unit further comprising intermediate safety and control devices and being adapted to transmit such information to the various receivers or load circuits of the equipment, and a fault-tracing outlet associated with said circuit unit for rapidly checking all the load circuits and units involved.

The control information is distributed directly in case the control circuit acts at the same time as a power circuit, or indirectly if servo means are used, for example in case of remote control by relay means for operating a flashing direction indicator system, a delay-action windscreen-wiper system, etc.

Thus, with the central circuit control plate of this invention certain units such as remote-control relays, fuse box or boxes, temperature-responsive circuit-breakers, windscreen-wiper delay-action units, and the like, can be assembled at a central location within the passenger compartment.

Other features and advantages of this invention will appear as the following description proceeds with reference to the attached drawings, in which:

FIG. 1 is a basic diagram of the central circuit control plate of this invention;

Figure 1:
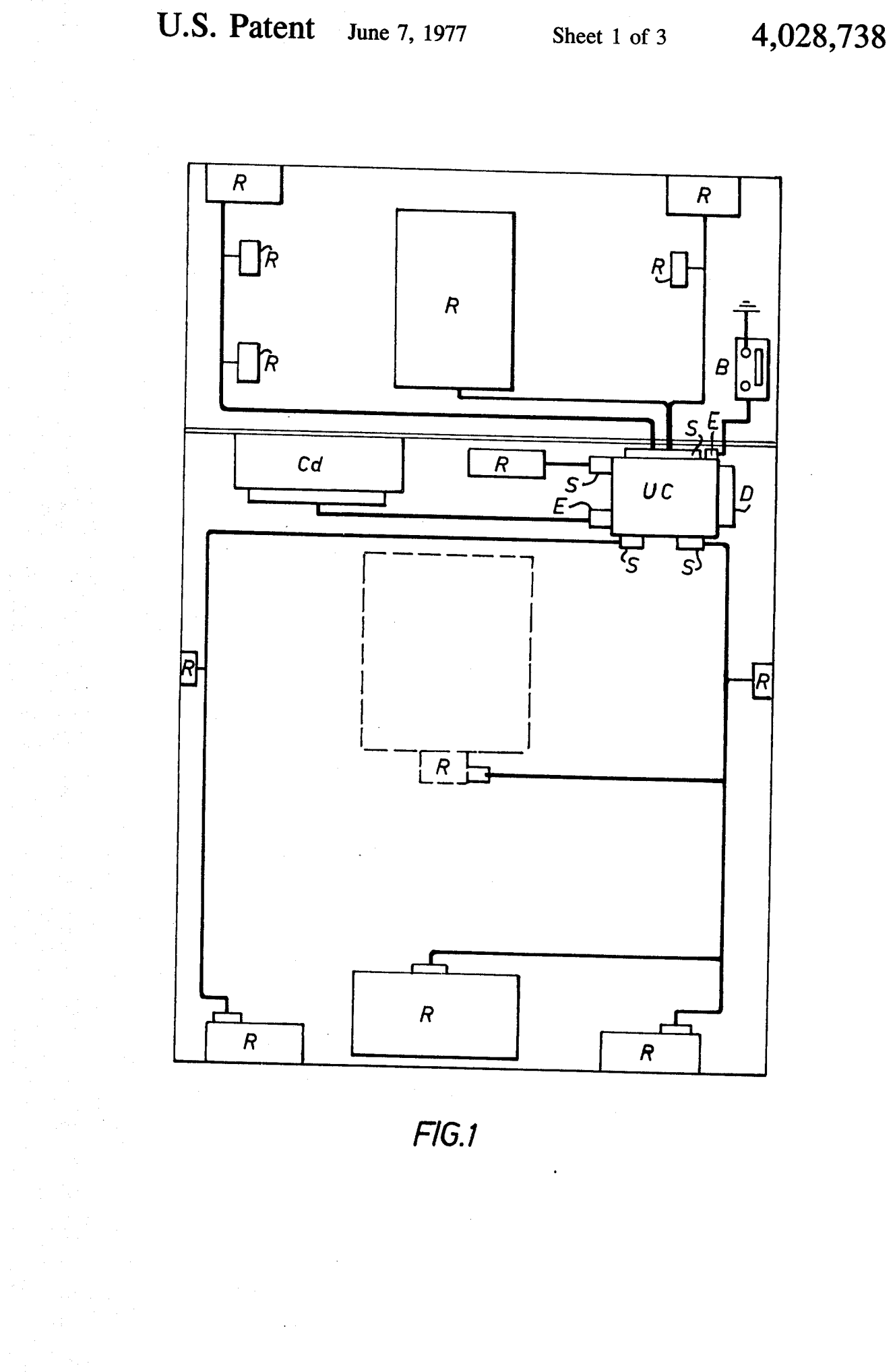

Referring firstly to FIG. 1 of the drawings, a central circuit unit control plate UC according to this invention has one input E connected to a source of electric current, namely the storage battery B of the motor vehicle. Another input E of this control plate is connected to the central control unit Cd usually incorporated in the instrument panel of the vehicle and from which various control information is delivered to certain units of the electrical equipment of the vehicle. Separate controls are also provided and transmit their control information to the central circuit control plate UC. The circuit unit of this plate is connected via its outputs S to the various load circuits, receivers or units R to be controlled, such as lighting apparatus, air-conditioning apparatus, flashing direction indicators, possibly the ignition system and/or the fuel injection system, servomotors, etc. This circuit unit UC delivers the control data to the various receivers or load circuits either directly or through servo means carried by said unit.

Figure 2:
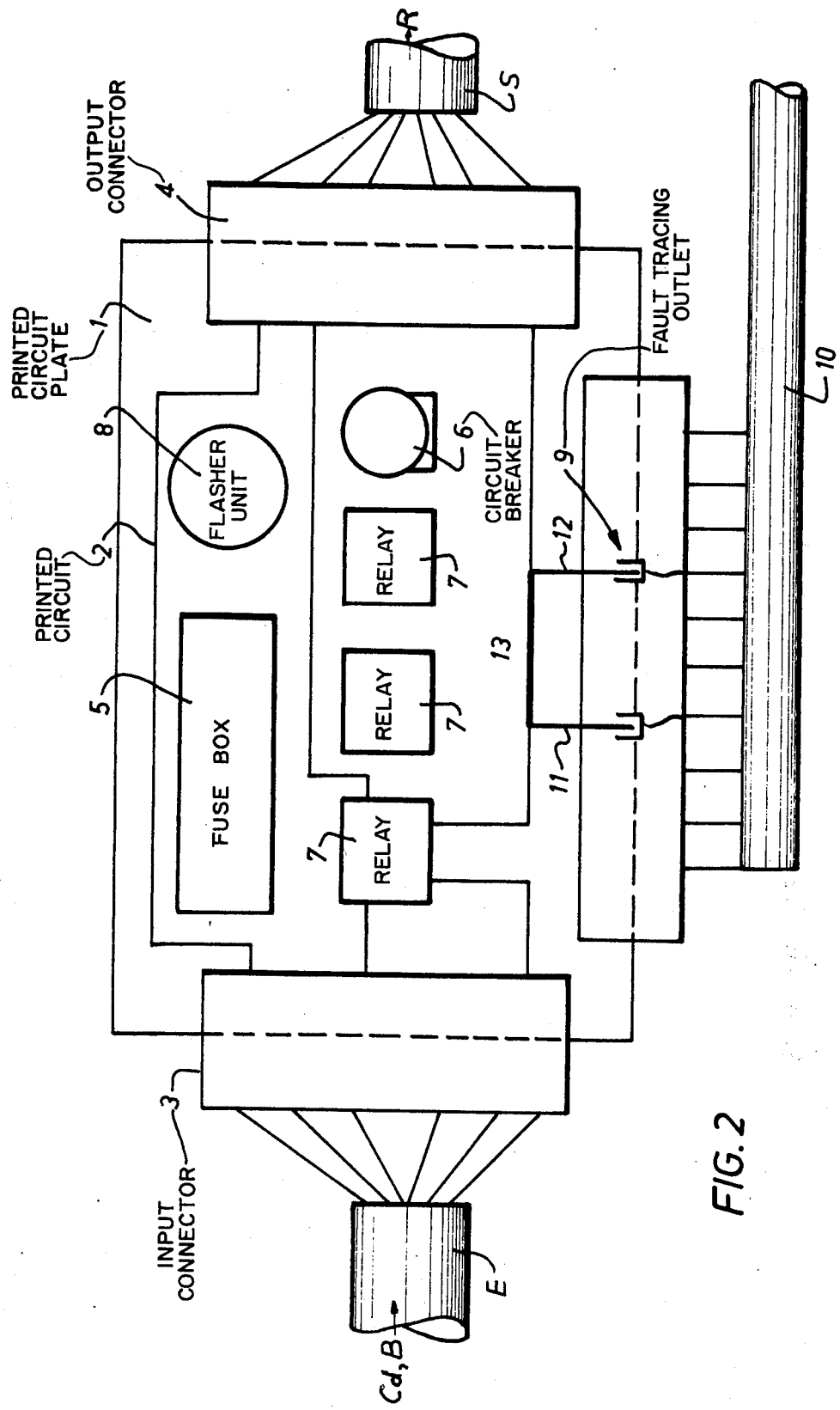
FIG. 2 is a diagrammatic illustration of this plate.

As shown in FIG. 2, the central portion of this circuit unit UC comprises a circuit base plate having detachably secured thereto a printed-circuit plate 1 supporting a printed circuit prepared beforehand and designated in general by the reference numeral 2. An input connector 3 is provided at one end for connecting the cluster of input cables and conductors E from the control unit Cd of the separate control devices and from the source of current B to the printed circuit 2. Another connector 4 is provided at the opposite end for connecting this printed circuit 2 to the cluster of output cables and conductors S to the various units R of the electrical equipment.

The printed circuit 2 comprises essentially a set of circuits for supplying directly to the corresponding units, other circuits for supplying current to other units but through the medium of contact or switching means responsive to intermediate relays or safety devices, and further circuits for energizing these relays.

The various intermediate control and safety devices are plugged to plate 1 and in direct contact with the corresponding conductors of printed circuit 2.

Thus, as illustrated by way of example in FIG. 2, the assembly may comprise a fuse box 5 for protecting the various supply circuits, a temperature responsive circuit breaker 6, various feed relays 7 (for example those controlling the headlamps), a flasher unit 8 for the direction indicators, etc. Of course, the number of relays or other members illustrated is not limited by this disclosure. Furthermore, the plate 1 may also carry a windscreen wiper control system incorporating if desired a time-lag device, a fuel injection control system, an ignition control system, other means for controlling the anti-skid device in the braking system (for preventing the road wheels from being locked during brake applications), and other control and safety devices as may be required by the particular equipment of the vehicle.

A fault-tracing outlet 9 is provided and permits the rapid connection of the various circuits of the unit, via a cable 10, to a test or check bench for a diagnosis obtained through the rapid checking of all the circuits and units involved. To this end, the fault-tracing outlet comprises for each circuit to be checked a pair of taps 11, 12 connected to the terminals of a gauged section 13 acting as a reference standard, inserted in the circuit contemplated. Thus, the conductors of said cable 10, which are connected to the various taps 11, 12 permit the measurement of the voltage across the terminals of standard 13 and thus determine the current value supplied to each unit of the electrical equipment of the vehicle.

Figure 3:
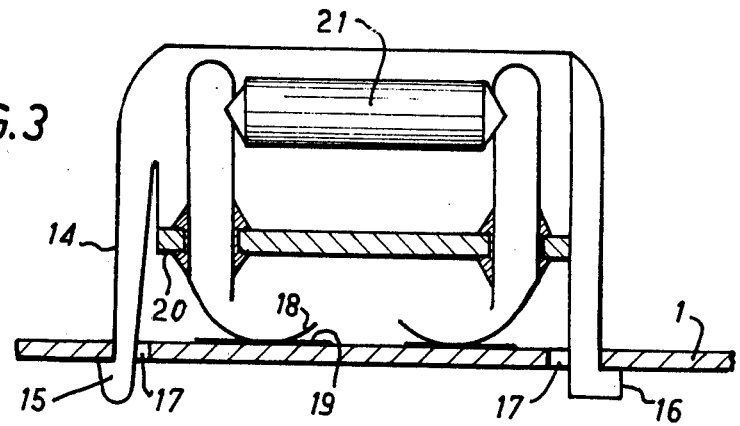
FIG. 3 is a detail view showing a typical mounting of a fuse box to the plate.
Figure 4:
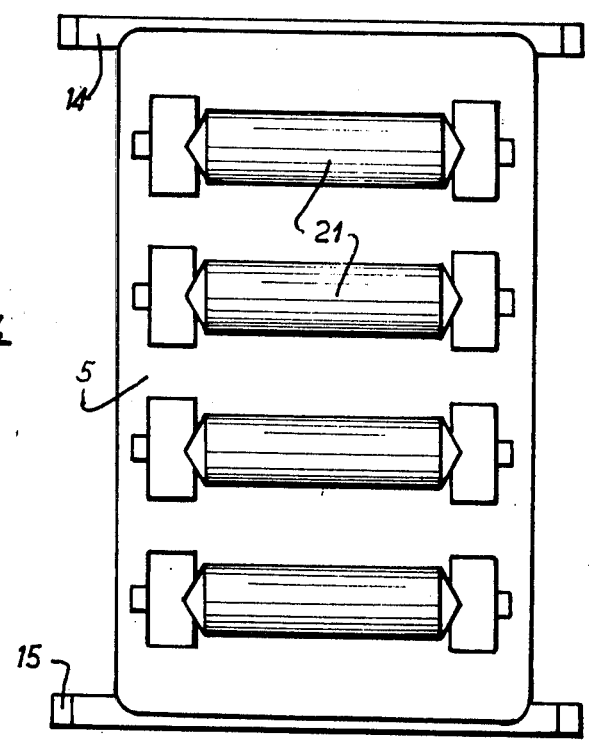
FIG. 4 is a plane view from above the fuse box.

The various safety and control devices and members are fastened as shown in FIGS. 3 and 4, by snap-action; these figures illustrate by way of example the fastening in position of a fuse box.

This fuse box comprises integral resilient legs 14 formed in turn at their free or lower ends with integral claws 15, 16. The box is attached to the plate 1 by snapping these free or lower ends into corresponding apertures 17 formed in the plate. Resilient metal shoes 18 attached to the terminals of the fuse clamps or like supports 20 engage the corresponding strips 19 of the printed circuit 2 and thus connect the fuses 21 to the corresponding circuits.

Although a specific form of embodiment of this invention has been described hereinabove and illustrated in the accompanying drawings, it will readily occur to those skilled in the art that various modifications and changes may be brought thereto without departing from the scope of the invention as set forth in the appended claims.

What is claimed is:

1. A central circuit control plate for the electrical equipment of motor vehicles, the equipment including different control devices on a vehicle dashboard emitting control information, safety devices and load circuits or receivers receiving said information, and a source of current to which said receivers are connected by means of said control devices, wherein said control plate comprises:

a single compact central unit including a predetermined circuit unit for distributing the control information to different load circuits or receivers which are all spaced apart from said control plate, means for transmitting said information, and intermediate safety and control members, connected between said predetermined circuit unit and said means for transmitting, for sending control information from said different control devices to said different load circuits or receivers of the vehicle;

a detachable printed circuit assembly plate having a plurality of controlled circuits, an input connector on the assembly plate connecting the controlled circuits to said source of current and to said means for transmitting, and an output connector connecting said printed circuit assembly plate to the different load circuits or receivers, intermediate safety and control members including fuses, circuit breakers, relays, and a flasher unit for direction indicators;

snap-action means for rapidly fixing to and removing from said assembly plate said intermediate safety and control devices when connecting to and disconnecting from said controlled circuits said safety and control devices; and wherein said snap-action means comprises resilient legs provided at their free ends with claws and wherein said assembly plate is provided with apertures corresponding to said legs, said claws fitting in a snap fashion into said apertures, said intermediate safety and control devices further comprising resilient metal shoes connected to terminals of said intermediate safety or control devices and engaging corresponding strips of said controlled circuits, said snap-action means being integral with a box for an intermediate safety and control device.

* * * * *